(12) United States Patent
Culic-Viskota et al.

(10) Patent No.: US 10,261,121 B2
(45) Date of Patent: Apr. 16, 2019

(54) DIAMOND-LIKE CARBON COATED SEMICONDUCTOR EQUIPMENT

(71) Applicant: Intel Corporation, Santa Clara, CA (US)

(72) Inventors: Jelena Culic-Viskota, Gilbert, AZ (US); Nader N. Abazarnia, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 149 days.

(21) Appl. No.: 15/165,896

(22) Filed: May 26, 2016

(65) Prior Publication Data

US 2017/0343599 A1    Nov. 30, 2017

(51) Int. Cl.
| | |
|---|---|
| *G01R 31/26* | (2014.01) |
| *C23C 14/06* | (2006.01) |
| *C23C 14/16* | (2006.01) |
| *C23C 16/06* | (2006.01) |
| *C23C 16/26* | (2006.01) |

(Continued)

(52) U.S. Cl.
CPC ...... *G01R 31/2601* (2013.01); *C23C 14/0605* (2013.01); *C23C 14/16* (2013.01); *C23C 16/06* (2013.01); *C23C 16/26* (2013.01); *C23C 28/32* (2013.01); *C23C 28/322* (2013.01); *C23C 28/343* (2013.01); *G01R 1/04* (2013.01); *G01R 1/44* (2013.01); *H01L 21/67092* (2013.01); *H01L 21/67103* (2013.01); *H01L 21/68757* (2013.01)

(58) Field of Classification Search
USPC ........ 118/500, 728; 428/336, 408, 457, 469, 428/472
See application file for complete search history.

(56) References Cited

U.S. PATENT DOCUMENTS 5,916,370 A * 6/1999 Chang ............... H01L 21/68757
                                                    118/728
6,106,630 A * 8/2000 Frankel ............... C23C 16/4581
                                                    118/725

(Continued)

OTHER PUBLICATIONS

International Search Report and Written Opinion dated Jul. 31, 2017 for International Application No. PCT/US2017/029649, 13 pages.

*Primary Examiner* — Archene A Turner
(74) *Attorney, Agent, or Firm* — Schwabe, Williamson & Wyatt, P.C.

(57) ABSTRACT

Embodiments of the present disclosure describe semiconductor equipment devices having a metal workpiece and a diamond-like carbon (DLC) coating disposed on a surface of the metal workpiece, thermal semiconductor test pedestals having a metal plate and a DLC coating disposed on a surface of the metal plate, techniques for fabricating thermal semiconductor test pedestals with DLC coatings, and associated configurations. A thermal semiconductor test pedestal may include a metal plate and a DLC coating disposed on a surface of the metal plate. The metal plate may include a metal block formed of a first metal and a metal coating layer formed of a second metal between the metal block and the DLC coating. An adhesion strength promoter layer may be disposed between the metal coating layer and the DLC coating. Other embodiments may be described and/or claimed.

6 Claims, 3 Drawing Sheets

(51) Int. Cl.
*C23C 28/00* (2006.01)
*G01R 1/04* (2006.01)
*G01R 1/44* (2006.01)
*H01L 21/67* (2006.01)
*H01L 21/687* (2006.01)

(56) References Cited

U.S. PATENT DOCUMENTS

| | | | |
|---|---|---|---|
| 6,595,506 B1* | 7/2003 | Zide | B25B 11/005 |
| | | | 118/728 |
| 2002/0083898 A1 | 7/2002 | Hosokawa | |
| 2003/0047283 A1* | 3/2003 | Parkhe | C23C 16/4581 |
| | | | 118/728 |
| 2005/0045106 A1* | 3/2005 | Boyd, Jr. | B23Q 3/154 |
| | | | 118/728 |
| 2005/0274325 A1 | 12/2005 | Kuibira et al. | |
| 2008/0016684 A1 | 1/2008 | Olechnowicz et al. | |
| 2009/0142599 A1* | 6/2009 | Dekempeneer | C23C 14/0605 |
| | | | 428/408 |
| 2011/0017424 A1 | 1/2011 | Parkhe et al. | |

\* cited by examiner

DIAMOND-LIKE CARBON COATED SEMICONDUCTOR EQUIPMENT

TECHNICAL FIELD

The present disclosure relates generally to the field of semiconductor fabrication and test equipment and, more specifically, to semiconductor fabrication and test equipment with improved wear resistance.

BACKGROUND

Equipment used in semiconductor package assembly and test processes is subject to wear and tear due to the high number of repetitive steps involved in semiconductor manufacturing and testing. Thermal test modules typically use nickel-coated copper pedestals that repeatedly contact bare die, over-molded die, or lidded packages. The role of the pedestal is to provide an efficient heat transfer path from the product to avoid thermal overstress to the silicon. During repeated cycling interactions of the pedestal with semiconductor packages, considerable pedestal wear is observed, resulting in a need for pedestal replacement. During actuation of the test pedestal with a semiconductor product, the presence of hard foreign material (FM) particles from the automated testing (AT) process can embed in the pedestal with the potential to propagate cracks or cosmetic scratches in the product, resulting in yield loss. Additionally, the same pedestal is typically cycled thousands of times, and shear damage may accumulate in the form of pitting and thinning of the plating material on the pedestal. The exposure of a copper layer under nickel plating can lead to copper oxide spallation and introduce undesired FM particles in the process and/or factory. In addition to the introduction of FM particles in the test module, the thermal performance of the pedestal may suffer with plating removal, due to uneven contact with the surface of the semiconductor product and air gap introduction. Although some ceramic materials have been used for test pedestals, they may be brittle, making them a costly and unviable alternative in some situations due to difficulty of manufacturing and handling.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
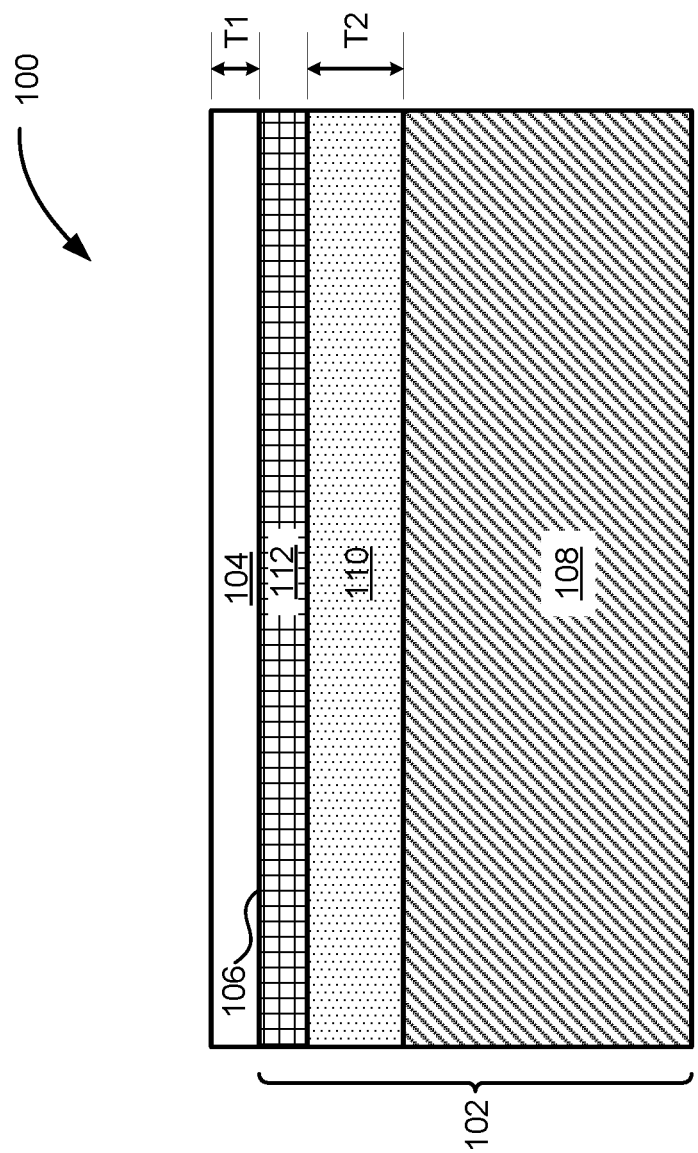
FIG. 1 schematically illustrates a cross-sectional side view of a thermal semiconductor test pedestal that may include a diamond-like carbon coating, in accordance with various embodiments.

Embodiments herein may include semiconductor equipment devices having a metal workpiece and a diamond-like carbon (DLC) coating disposed on a surface of the metal workpiece, thermal semiconductor test pedestals having a metal plate and a DLC coating disposed on a surface of the metal plate, techniques for fabricating thermal semiconductor test pedestals with DLC coatings, and associated configurations. A thermal semiconductor test pedestal may include a metal plate and a DLC coating disposed on a surface of the metal plate. The metal plate may include a metal block formed of a first metal and a metal coating layer formed of a second metal disposed between the metal block and the DLC coating. An adhesion strength promoter layer may be disposed between the metal coating layer and the DLC coating.

In the following detailed description, reference is made to the accompanying drawings that form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other.

In various embodiments, the phrase "a first layer formed on a second layer" may mean that the first layer is formed over the second layer, and at least a part of the first layer may be in direct contact (e.g., direct physical and/or electrical contact) or indirect contact (e.g., having one or more other layers between the first layer and the second layer) with at least a part of the second layer.

FIG. 1 schematically illustrates a cross-sectional side view of a thermal semiconductor test pedestal 100, in accordance with various embodiments. In some embodiments, the semiconductor test pedestal 100 may include a metal plate 102 and a diamond-like carbon (DLC) coating 104, having a thickness T1, disposed on a surface 106 of the metal plate 102. In some embodiments, the metal plate 102 may include a metal block 108 formed of a first metal and a metal coating layer 110, having a thickness T2, formed of a second metal disposed between the metal block 108 and the DLC coating 104. In various embodiments, the metal coating layer 110 may be plated on or otherwise coupled with the metal block 108. In some embodiments, the metal block 108 may be formed of copper and the metal coating layer 110 may be a nickel or aluminum layer plated on the copper of the metal block 108. In other embodiments, the metal block 108 may be formed of a metal such as aluminum or stainless steel. In some embodiments, the metal plate 102 may include an adhesion strength promoter layer 112 that may be disposed between the metal coating layer 110 and the DLC coating 104. In various embodiments, the adhesion strength promoter layer 112 may include a carbide forming material such as at least one of titanium (Ti), tungsten (W), chromium (Cr), or iron (Fe).

In various embodiments, the metal block 108 may be a Cu metal block, the metal coating layer 110 may be a Ni coating layer plated on the Cu metal block, and the DLC coated Ni-plated Cu pedestal may have a hardness greater than or equal to approximately 27.5 gigapascals (GPa) as measured by nanoindentation metrology. In some embodiments, this hardness of the DLC coated pedestal may compare favorably with typical hardness values of non-DLC coated pedestals such as a hardness value of approximately 7.5 GPa for a Ni-plated Cu pedestal that does not include a DLC coating. A typical hardness of a silicon die may be approximately 12 GPa, such that the DLC coated pedestal, having a greater hardness than the silicon die, may undergo less wear than an uncoated pedestal in various embodiments. In some embodiments, DLC coating of the pedestal may allow for less frequent pedestal replacement, cost savings, and/or a lower likelihood of having a piece of FM such as silicon impinged on its surface during a testing process, causing potential damage to a next set of products to be tested.

In some embodiments, the DLC coating 104 may be an amorphous carbon in sp2 and sp3 hybridization. In various embodiments, the thickness T1 of the DLC coating 104 may be less than or equal to approximately 5 micrometers (μm), also referred to as microns herein, and in some embodiments the thickness T1 of the DLC coating 104 may be greater than or equal to approximately 2 microns and less than or equal to approximately 4 microns. In some embodiments, the thickness T1 of the DLC coating 104 may be approximately 2 microns. In various embodiments, the use of a thin DLC coating 104 may provide increased wear resistance while still having a very small effect on the thermal resistance of the pedestal 100 because thermal resistance scales proportionally with the thickness of the material which may also be referred to as a bond line thickness (BLT), and scales inversely with the thermal conductivity (k) of the material which can generally be represented with the equation R=BLT/k, where R is the thermal resistance. In some embodiments, the thermal resistance of the DLC coating 104 may be on the order of approximately $10^{-3}$ to $10^{-4}$ ° Celsius·centimeters$^2$/Watt (° C. cm$^2$/W), resulting in the added DLC coating 104 having no significant effect on the overall thermal resistance of the pedestal 100. In some embodiments, the thickness T2 of the metal coating layer 110 may be greater than or equal to approximately 12 microns and less than or equal to approximately 25 microns.

In some embodiments, the metal plate 102 may be formed of a material such as stainless steel that does not require an adhesion strength promoter layer, and the DLC coating 104 may be disposed directly on a surface of the stainless steel rather than on an adhesion strength promoter layer. In various embodiments, the adhesion strength promoter layer may not be required because an alloy of the metal forming the metal plate 102 may already include sufficient carbon (C) content, as with stainless steel. In some embodiments, the metal coating layer 110 may not be present and the adhesion strength promoter layer 112 may be disposed on the metal block 108.

Figure 2:
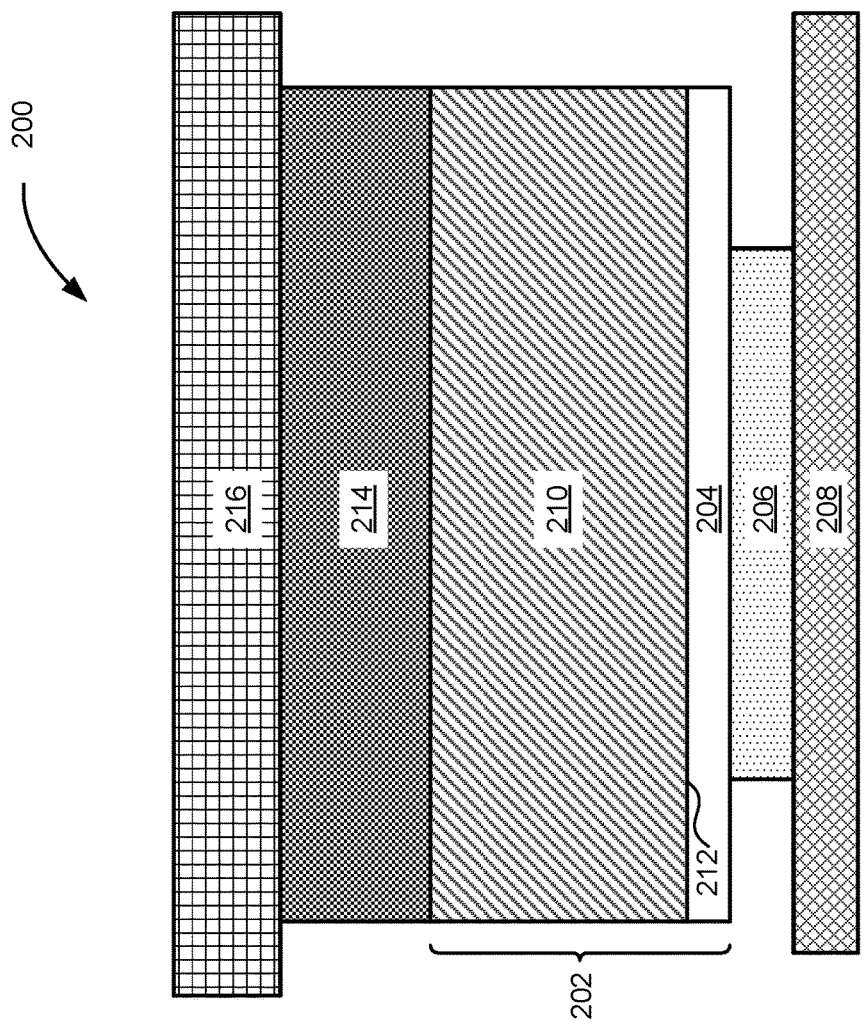
FIG. 2 schematically illustrates a cross-sectional side view of a semiconductor equipment device that may include a workpiece having a diamond-like carbon coating, in accordance with various embodiments.

FIG. 2 schematically illustrates a cross-sectional side view of a semiconductor equipment device 200 that may include a workpiece 202 having a diamond-like carbon coating 204, in accordance with various embodiments. In some embodiments, during operation of the semiconductor equipment device 200, the workpiece 202 may come into contact with a die 206 that may be on a substrate 208. In various embodiments, the workpiece 202 may come into direct contact with bare die, over-molded die, or lidded packages during repeated cycling interactions with semiconductor products. The workpiece 202 is shown in contact with the die 206, but it should be understood that the die 206 and the substrate 208 are not a part of the semiconductor equipment device 200 and that the workpiece 202 may come into contact with many different dies 206 during operation of the semiconductor equipment device 200.

The die 206 may represent a discrete product made from a semiconductor material (e.g., silicon) using semiconductor fabrication techniques such as thin film deposition, lithography, etching, and the like used in connection with forming complementary metal-oxide-semiconductor (CMOS) devices. In some embodiments, the die 206 may be, include, or be a part of a radio frequency (RF) die. In other embodiments, the die may be, include, or be a part of a processor, memory, system-on-chip (SoC), or application specific integrated circuit (ASIC).

In some embodiments, the workpiece 202 may be a metal workpiece such as semiconductor test pedestal 100 described with respect to FIG. 1. In some embodiments, a metal layer 210 of the workpiece 202 may correspond to the metal plate 102 of the semiconductor test pedestal 100 described with respect to FIG. 1. In various embodiments, the DLC coating 204 may be disposed on a surface 212 of the metal layer 210. In some embodiments, the semiconductor equipment device 200 may be a thermal control unit that may include a temperature regulation stage 214 coupled with the metal layer 210, which may be the metal plate 102 of the thermal semiconductor test pedestal 100. In various embodiments, the temperature regulation stage 214 may include a chiller plate and/or a heater plate. A temperature sensor (not shown) may be coupled with the workpiece 202 such that a controller (not shown) may generate control signals to control the temperature regulation stage 214 in response to a temperature of the workpiece 202 as sensed by the temperature sensor to keep the workpiece 202 at a predefined temperature or within a predefined temperature range. A positioner 216 may be coupled with the temperature regulation stage 214 and/or the workpiece 202 to position the workpiece 202 into and out of contact with semiconductor products such as the die 206. In some embodiments, the workpiece 202 may be removable from the semiconductor equipment device 200 so that it may be replaced when needed.

In other embodiments, the semiconductor equipment device 200 may be another type of semiconductor fabrication or test equipment such as a thermal compression bonding (TCB) device where the workpiece 202 may be a TCB head, a saw used in singulation and trimming processes of substrate panels and wafers, a drill for drilling plated through holes in substrate, or may include a thermal collateral used in different test processes such as a thermal heat sink. In various embodiments, the DLC coating 204 may coat other portions of the metal layer 210 than those shown (e.g., multiple outer surfaces of a saw blade or outer surfaces of a drill bit). In some embodiments, the temperature regulation stage 214 may not be present, or a different device block may be coupled with the workpiece 202 and/or the positioner 216 that may include one or more elements in accordance with the type of semiconductor equipment device 200 that includes the workpiece 202.

Figure 3:
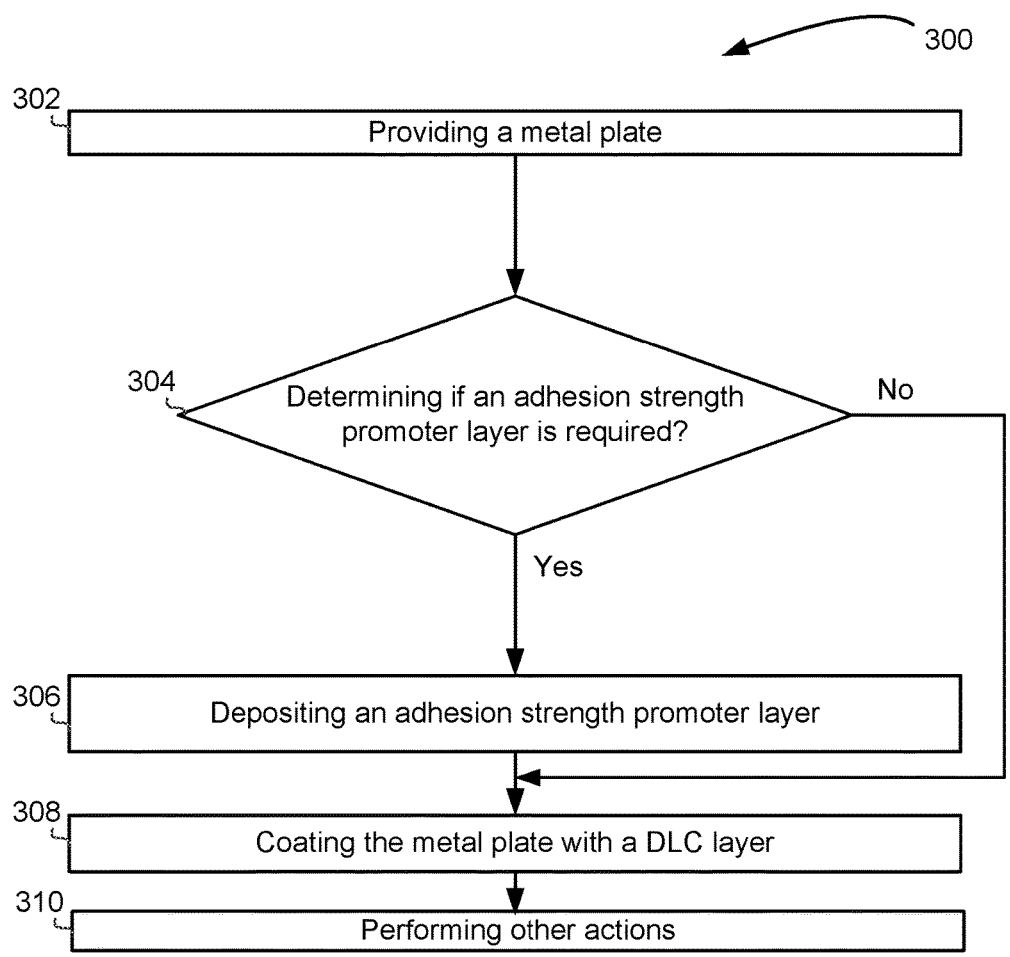
FIG. 3 schematically illustrates a flow diagram for a process of fabricating a thermal semiconductor test pedestal such as the thermal semiconductor test pedestal of FIG. 1, in accordance with various embodiments.

FIG. 3 schematically illustrates a flow diagram for a process 300 of fabricating a thermal semiconductor test pedestal such as the thermal semiconductor test pedestal 100 of FIG. 1, in accordance with various embodiments. In various embodiments, the process 300 may include providing a metal plate (e.g., metal plate 102 of FIG. 1) at a block 302. The metal plate may include a metal block formed of a material such as stainless steel or copper in various embodiments. In some embodiments, the metal block may include a metal coating layer (e.g., metal coating layer 110 of FIG. 1) that may be formed of a different material than the metal block. In some embodiments, the metal block may be a copper metal block and the metal coating layer may be formed of nickel (Ni) or aluminum (Al). At a decision block 304, the process 300 may include determining whether an adhesion strength promoter layer is required.

If, at the decision block 304, it is determined that an adhesion strength promoter layer is required, the process may proceed to a block 306 and may include depositing an adhesion strength promoter layer (e.g., adhesion strength promoter layer 112 of FIG. 1) at the block 306. In various embodiments, the adhesion strength promoter layer may include at least one of titanium (Ti), tungsten (W), chromium (Cr), or iron (Fe). In some embodiments, the adhesion strength promoter layer may be deposited using at least one of physical vapor deposition (PVD) or chemical vapor deposition (CVD). In some embodiments, the process 300 may then proceed to a block 308 and may include coating the metal plate with a diamond-like carbon (DLC) layer (e.g., DLC coating 104 or FIG. 1 or DLC coating 204 of FIG. 2). In various embodiments, coating the metal plate with the DLC layer may include depositing the DLC layer using at least one of PVD or CVD over the adhesion strength promoter layer.

If, at the decision block 304, it is determined that an adhesion strength promoter layer is not required, such as when the metal plate may be a stainless steel metal plate, the process 300 may proceed to the block 308 and may include depositing a DLC layer at the block 308 directly on the metal plate without an adhesion strength promoter layer. In various embodiments, the process 300 may include performing other actions at a block 310.

The following paragraphs provide examples of various ones of the embodiments disclosed herein.

Example 1 may include a thermal semiconductor test pedestal comprising: a metal plate; and a diamond-like carbon (DLC) coating disposed on a surface of the metal plate, wherein a surface of the DLC coating is to contact a semiconductor product during operation of the thermal semiconductor test pedestal.

Example 2 may include the subject matter of Example 1, wherein the metal plate includes a metal block formed of a first metal and a metal coating layer formed of a second metal disposed between the metal block and the DLC coating.

Example 3 may include the subject matter of Example 2, further comprising an adhesion strength promoter layer disposed between the metal coating layer and the DLC coating.

Example 4 may include the subject matter of Example 3, wherein the adhesion strength promoter layer includes at least one of titanium (Ti), tungsten (W), chromium (Cr), or iron (Fe).

Example 5 may include the subject matter of any one of Examples 1-4, wherein the DLC coating has a hardness greater than or equal to approximately 27.5 gigapascals (GPa).

Example 6 may include the subject matter of any one of Examples 1-5, wherein the DLC coating is an amorphous carbon in sp2 and sp3 hybridization.

Example 7 may include the subject matter of any one of Examples 1-6, wherein the DLC coating has a thickness of less than or equal to approximately 5 microns.

Example 8 may include the subject matter of any one of Examples 1-7, wherein the DLC coating has a thickness of greater than or equal to approximately 2 microns and less than or equal to approximately 5 microns.

Example 9 may include the subject matter of Example 1, wherein the metal plate is formed of stainless steel.

Example 10 may include the subject matter of any one of Examples 2-4, wherein the metal block is formed of copper (Cu), stainless steel (SS) or aluminum (Al).

Example 11 may include the subject matter of Example 10, wherein the metal coating layer is formed of nickel (Ni).

Example 12 may include the subject matter of any one of Examples 10-11, wherein the metal coating layer has a thickness of greater than or equal to approximately 12 microns and less than or equal to approximately 25 microns.

Example 13 may include the subject matter of any one of Examples 1-2, further comprising an adhesion strength promoter layer disposed between the metal plate and the DLC coating, wherein the adhesion strength promoter layer includes a carbide forming material.

Example 14 may include a semiconductor equipment device comprising: a metal workpiece; and a diamond-like carbon (DLC) coating disposed on a surface of the metal workpiece, wherein a surface of the DLC coating is to contact a semiconductor product during operation of the semiconductor equipment device.

Example 15 may include the subject matter of Example 14, wherein the metal workpiece is a metal plate of a thermal semiconductor test pedestal.

Example 16 may include the subject matter of Example 15, wherein the semiconductor equipment device is a thermal control unit further comprising a temperature regulation stage coupled with the metal plate of the thermal semiconductor test pedestal.

Example 17 may include the subject matter of Example 14, wherein the metal workpiece is a thermal compression bonding (TCB) head.

Example 18 may include the subject matter of any one of Examples 14-17, wherein the metal workpiece includes a base structure formed of a first metal and a metal coating layer formed of a second metal, wherein the second metal is different than the first metal and the metal coating layer is plated on the base structure.

Example 19 may include the subject matter of Example 18, further comprising an adhesion strength promoter layer disposed between the metal coating layer and the DLC coating.

Example 20 may include a method of fabricating a thermal semiconductor test pedestal comprising: providing a metal plate; and coating the metal plate with a diamond-like carbon (DLC) layer, wherein a surface of the DLC layer is to contact a semiconductor die during operation of the thermal semiconductor test pedestal.

Example 21 may include the subject matter of Example 20, further comprising depositing an adhesion strength promoter layer on the metal plate before coating the metal plate with the DLC layer.

Example 22 may include the subject matter of Example 21, wherein the metal plate includes a copper (Cu) block and a metal coating layer disposed between the Cu block and the DLC layer, wherein the metal coating layer is formed of a metal different than Cu.

Example 23 may include the subject matter of Example 22, wherein the metal coating layer is formed of nickel (Ni).

Example 24 may include the subject matter of any one of Examples 21-23, wherein the adhesion strength promoter layer includes at least one of titanium (Ti), tungsten (W), chromium (Cr), or iron (Fe).

Example 25 may include the subject matter of any one of Examples 21-24, wherein the adhesion strength promoter layer is deposited using at least one of physical vapor deposition (PVD) or chemical vapor deposition (CVD) and coating the metal plate includes depositing the DLC layer on the adhesion strength layer using at least one of PVD or CVD.

What is claimed is:

1. A thermal semiconductor test pedestal comprising:
    a metal plate that includes a metal block formed of copper (Cu), and a metal coating layer formed of nickel (Ni); and
    a diamond-like carbon (DLC) coating disposed on a surface of the metal plate, wherein a surface of the DLC coating is to contact a semiconductor product during operation of the thermal semiconductor test pedestal, wherein the pedestal has a hardness greater than or equal to 27.5 gigapascals (GPa).

2. The thermal semiconductor test pedestal of claim 1, further comprising an adhesion strength promoter layer disposed between the metal coating layer and the DLC coating.

3. The thermal semiconductor test pedestal of claim 2, wherein the adhesion strength promoter layer includes at least one of titanium (Ti), tungsten (W), chromium (Cr), or iron (Fe).

4. The thermal semiconductor test pedestal of claim 1, wherein the DLC coating has a thickness of greater than or equal to approximately 2 microns and less than or equal to approximately 5 microns.

5. The thermal semiconductor test pedestal of claim 1, wherein the metal coating layer has a thickness of greater than or equal to approximately 12 microns and less than or equal to approximately 25 microns.

6. The thermal semiconductor test pedestal of claim 1, further comprising an adhesion strength promoter layer disposed between the metal plate and the DLC coating, wherein the adhesion strength promoter layer includes a carbide forming material.

\* \* \* \* \*